United States Patent [19]

McCollum

[11] Patent Number: 5,525,909

[45] Date of Patent: *Jun. 11, 1996

[54] APPARATUS AND METHOD FOR MEASURING PROGRAMMED ANTIFUSE RESISTANCE

[75] Inventor: John L. McCollum, Saratoga, Calif.

[73] Assignee: Actel Corporation, Sunnyvale, Calif.

[*] Notice: The term of this patent shall not extend beyond the expiration date of Pat. No. 5,414,364.

[21] Appl. No.: 434,396

[22] Filed: May 3, 1995

Related U.S. Application Data

[63] Continuation of Ser. No. 117,955, Sep. 8, 1993, Pat. No. 5,414,364.

[51] Int. Cl.$^6$ ............................ G01R 31/02; G11C 17/16
[52] U.S. Cl. ...................... 324/550; 324/713; 257/530; 326/38; 327/525
[58] Field of Search ..................................... 324/550, 691, 324/713, 715, 719, 158.1, 765, 768, 769; 326/37; 327/525; 365/96; 371/22.5, 22.6; 257/530

[56] References Cited

U.S. PATENT DOCUMENTS

| 4,255,748 | 3/1981 | Bartlett | 340/661 |
|---|---|---|---|
| 4,625,313 | 11/1986 | Springer | 371/22.6 |
| 4,638,243 | 1/1987 | Chan | 324/509 |
| 4,718,042 | 1/1988 | Moll et al. | 365/201 |
| 4,800,176 | 1/1989 | Kakumu et al. | 437/193 |
| 4,935,645 | 6/1990 | Lee | 327/88 |
| 5,272,388 | 12/1993 | Bakker | 327/525 |
| 5,293,133 | 3/1994 | Birkner et al. | 324/713 |
| 5,414,364 | 5/1995 | McCollum | 324/550 |

Primary Examiner—Kenneth A. Wieder
Assistant Examiner—Diep Do
Attorney, Agent, or Firm—D'Alessandro & Ritchie

[57] ABSTRACT

Apparatus for measuring the resistance of a programmed antifuse in an integrated circuit is integrated on the same integrated circuit as the antifuse and is controlled by a programming circuit disposed on an integrated circuit and comprises a first voltage sensing transistor having a first drain/source electrically connected to a first I/O pad, a gate electrically connected to the programming circuit, and a second drain/source electrically connected to a first electrode of the antifuse, and a second voltage sensing transistor having a first drain/source electrically connected to a second I/O pad, a gate electrically connected to the programming circuit, and a second drain/source electrically connected to a second electrode of the antifuse.

2 Claims, 2 Drawing Sheets

3,525,909

APPARATUS AND METHOD FOR MEASURING PROGRAMMED ANTIFUSE RESISTANCE

RELATED APPLICATIONS

This is a continuation of application Ser. No. 08/117,955, filed Sep. 8, 1993, now U.S. Pat. No. 5,414,364.

BACKGROUND OF THE INVENTION

1. Field of the Invention

The present invention relates to integrated electronic circuit technology. More particularly, the present invention relates to electrically programmable antifuse elements and to methods for measuring the resistance of programmed antifuse elements.

2. The Prior Art

Antifuses typically consist of a metal/dielectric/metal sandwich where the dielectric can be any material that is not a conductor, for example amorphous silicon. Once an antifuse has been programmed into a conducting state, it may later become open or non-conductive. It has been found that this is more likely to occur when the resistance of a programmed antifuse is higher than desired or expected as measured shortly after programming. As such, the reliability of a programmed antifuse is more readily guaranteed when the resistance of the programmed antifuse is known.

In the prior art, however, determining the resistance of a programmed antifuse has been a difficult task. One reason this difficulty arises is due to the fact that access to the programmed antifuse is typically had via the same circuit path which was used to program the antifuse. Those of ordinary skill in the art will recognize that the programming path is in series with the programmed antifuse and is a relatively high impedance path. The total resistance of this path may in fact normally be on the order of several hundred ohms, while the programmed antifuse generally has an impedance on the order of one hundred ohms.

Because of the location of the antifuse in this resistive network including the programming path, it has been extremely difficult to determine the actual resistance of an individual programmed antifuse in a normal integrated circuit. At best, a method based upon data taken from mechanical circuit probes at discrete programmed antifuses and a knowledge of the current which has passed through the devices have been used to provide a reasonable guess. Taking this data is possible only prior to the packaging process for the integrated circuit since it is not practical to measure the resistance of individual antifuses once the circuit has been encapsulated in a package.

It is therefore an object of the present invention to provide apparatus and a method for accurately determining the resistance of a programmed antifuse in an integrated circuit.

It is a further object of the present invention to provide apparatus and a method for accurately determining the resistance of a programmed antifuse in an integrated circuit after the integrated circuit has been packaged.

BRIEF DESCRIPTION OF THE INVENTION

In order to determine the resistance of a programmed antifuse by sensing the voltage across it, in the present invention a voltage sensing circuit controlled by a programming circuit is disposed on an integrated circuit and comprises a first voltage sensing transistor having a first drain/source electrically connected to a first I/O pad, a gate electrically connected to the programming circuit, and a second drain/source electrically connected to a first electrode of an antifuse, and a second voltage sensing transistor having a first drain/source electrically connected to a second I/O pad, a gate electrically connected to the programming circuit, and a second drain/source electrically connected to a second electrode of the antifuse.

According to the present invention, the resistance of each individual antifuse in an integrated circuit can be determined during the programming process. Based upon the resistance determined, a decision may be made whether to continue programming to lower the antifuse resistance or to reject an antifuse if it fails to reach a desired target resistance. Thus one advantage of the present invention is that it makes it possible to better guarantee the reliability of an antifuse.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
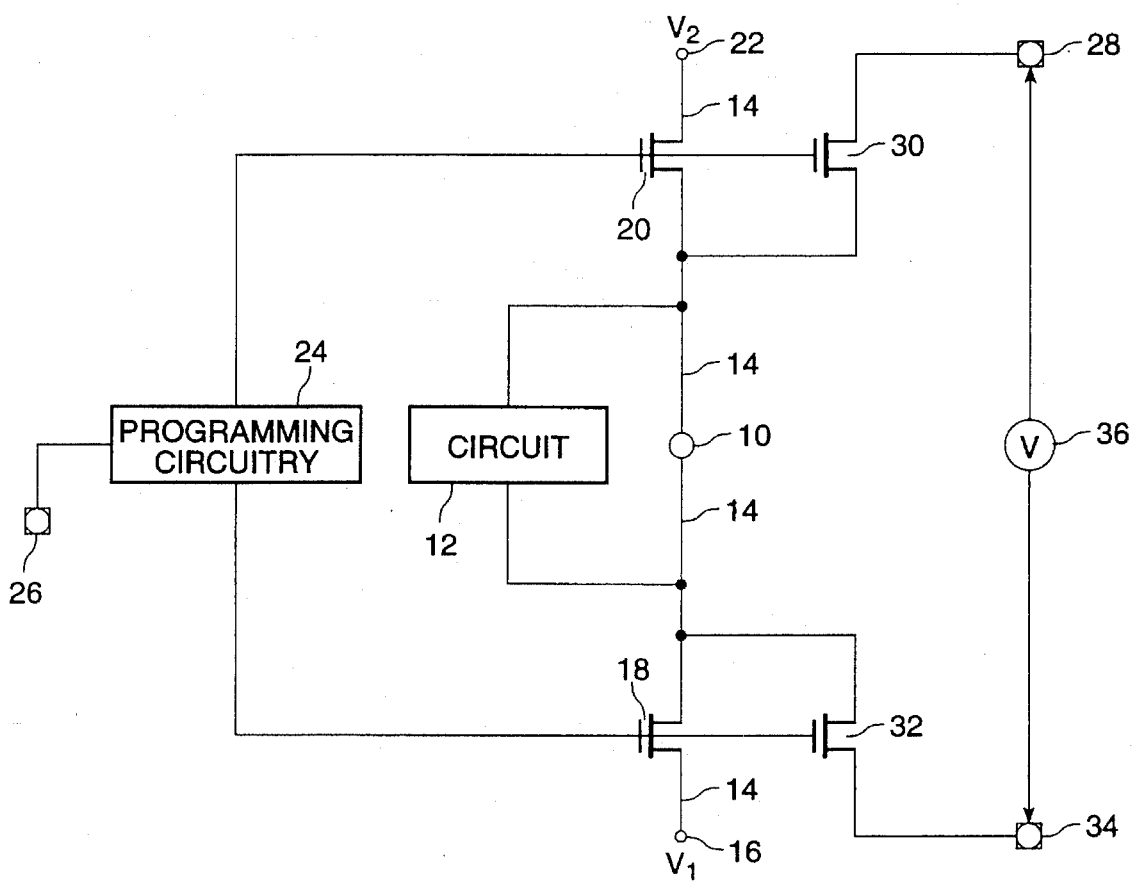
FIG. 1 is a simplified schematic diagram of an antifuse and accompanying programming circuit incorporating an antifuse resistance measuring circuit according to a presently preferred embodiment of the invention.

Referring first to FIG. 1, a simplified schematic diagram of a typical circuit for programming an antifuse is shown. Those of ordinary skill in the art will recognize that in an actual integrated circuit environment, there will be hundreds or even thousands of antifuses, and such persons will accordingly recognize that the programming circuitry depicted in FIG. 1 is simplified and thus merely illustrative for presenting a disclosure of the invention.

A typical example of an integrated circuit environment in which the present invention may be employed is disclosed in U.S. Pat. No. 4,758,745 which is expressly incorporated herein by reference. Those of ordinary skill in the art will recognize that the integrated circuit environment in the referenced patent is only one possible environment of the present invention and is not to be taken as in any way limiting the invention described herein.

As may be seen from FIG. 1, an antifuse 10 disposed in an integrated circuit is connected to some circuitry 12 with which it functions during the normal functioning of the integrated circuit in which it is contained. Those of ordinary skill in the art will recognize that circuitry 12 could take a myriad of forms, and will not always be present, such as where antifuse 10 is used for the purpose of interconnecting the conductors to which it is connected.

In order to program antifuse 10, a programming potential $V_{PP}$ must be placed across the electrodes of the antifuse 10. The programming potential $V_{PP}$ is supplied via a programming path 14 which includes a first node 16 carrying a first voltage potential $V_1$, first and second programming transistors 18 and 20, and a second node 22 carrying a second voltage potential $V_2$. The gates of first and second programming transistors 18 and 20 are driven from a programming controller circuit 24, which may be controlled from one or more I/O pads 26 on the integrated circuit. Circuitry such as illustrated in FIG. 1 for providing such an antifuse programming path 14 is commonly employed in antifuse based user programmable integrated circuits.

As may be seen from an examination of FIG. 1, the programming path 14 is a series circuit in which $V_{PP}=|V1-V2|$ may be thought of as a voltage source connected between first node 16 and second node 22. The series circuit comprises first programming transistor 18, antifuse 10, and second programming transistor 20. As will be appreciated by those of ordinary skill in the art, the aforementioned elements in the programming path 14 are connected together by metal interconnect lines typically employed in conventional integrated circuit technology.

The antifuse 10 will be programmed when sufficient voltage is applied to the gates of first and second programming transistors 18 and 20 such that first and second programming transistors 16 and 18 turn on, and $|V1-V2| \geq V_{PP}$ is thereby placed across the electrodes of the antifuse 10. Programming controller circuit 24 applies the appropriate voltage levels to the gates of first and second programming transistors 18 and 20 under control of circuitry located off chip and communicating via the one or more I/O pads 26. The structure and operation of exemplary circuitry for performing the function of programming controller circuit 24 is known in the art and an illustrative example may be seen in U.S. Pat. No. 4,758,475.

Once the antifuse 10 has been programmed, it is typical to pass a known soaking current through the programmed antifuse 10 to lower its resistance to a final acceptable value as known in the art and described, for example, in U.S. Pat. No. 5,126,282. As indicated previously, it would be advantageous at this point in the antifuse programming process to be able to accurately determine the resistance of the programmed antifuse 10. According to the present invention, the voltage across the programmed antifuse 10 is determined while the known soaking current is applied to the circuit, and Ohm's law is used to calculate the resistance of programmed antifuse 10 from the measured voltage and known soaking current.

To determine the voltage across the programmed antifuse 10, a voltage sensing path is implemented according to the principles of the present invention. The voltage sensing path includes a first voltage sensing I/O pad 28 is connected to the source of a first sensing transistor 30. The drain of the first sensing transistor 30 is connected to the first electrode of the antifuse 10. The second electrode of the antifuse 10 is connected to the source of a second sensing transistor 32. The drain of the second sensing transistor 32 is coupled a voltage sensing I/O pad 34.

Sensing the voltage across the programmed antifuse 10 is accomplished by applying the appropriate voltage to the gates of first and second sensing transistors 30 and 32 to turn them on. The voltage difference between the first and second voltage sensing I/O pads 28 and 34 is then measured with a high impedance voltmeter 36.

According to a presently preferred embodiment of the invention, the same programming control circuitry 24 used to provide voltage to the gates of first and second programming transistors 18 and 20 may be used to control first and second sensing transistors 30 and 32. More particularly, the gates of first and second sensing transistors 30 and 32, may be formed from the same polysilicon lines as the gates of first programming transistor 18 and second programming transistor 20. Those of ordinary skill in the art will realize that such an arrangement, wherein a single diffused region in a semiconductor substrate underlying the polysilicon line which forms the gates of transistors 18 and 32 is used to form those transistors, and another single diffused region in the semiconductor substrate underlying the polysilicon line which forms the gates of transistors 20 and 30 is used to form those transistors, allows for the provision of the extra sensing transistors with very little layout-area overhead.

The input impedance of a typical high impedance voltmeter may be around 1 Gohm. One of ordinary skill in the art would therefore recognize that a resistance of about 1 MOhm can be tolerated in the voltage sensing path between first and second voltage sensing I/O pads 28 and 34. Persons of ordinary skill in the art will appreciate that the first and second sensing transistors 30 and 32 may be small devices (i.e., about 5/1.2 microns) in comparison to the first and second programming transistors 18 and 20 which must be sized to provide adequate programming current to antifuse 10. Such skilled persons will also recognize that, because of the impedance which can be tolerated in the voltage sensing path, the interconnect lines coupling the elements in the voltage sensing path may be doped polysilicon conductors instead of metal lines, thus further simplifying the integration of the antifuse resistance measuring circuitry of the present invention into existing antifuse-based programmable circuit architectures.

According to the present invention, programming circuitry 24 applies a voltage to the gates of first and second programming transistors 18 and 20, simultaneously applying the gate voltage to first and second sensing transistors 30 and 32. A potential of $V_{PP}$ (i.e., $|V1-V2|$) is placed across antifuse 10, thus programming it. Voltmeter 36, connected between first and second voltage sensing I/O pads 28 and 34, may be monitored to determine when programming has taken place. Programming the antifuse 10 will typically cause a drop in measured voltage from $V_{PP}$ to a very small voltage value, i.e., less than about 1 volt.

To ensure that the antifuse 10 has been properly programmed, a known current is passed through the antifuse 10 during a soak cycle. During the soak cycle, the programming circuitry 24 again applies a voltage to the gates of first and second programming transistors 18 and 20 and sensing transistors 30 and first and second 32, and the voltage between first and second voltage sensing I/O pads 28 and 34 is sensed. The resistance of the programmed antifuse 10 may then be calculated from the known current and the sensed voltage. As a result of the measured resistance, the antifuse 10 can be further programmed or rejected as unreliable. Because of the availability of digital-based voltmeter technology, the further programming or rejection routines can be performed under computer control as will be readily appreciated by those of ordinary skill in the art.

Figure 2:
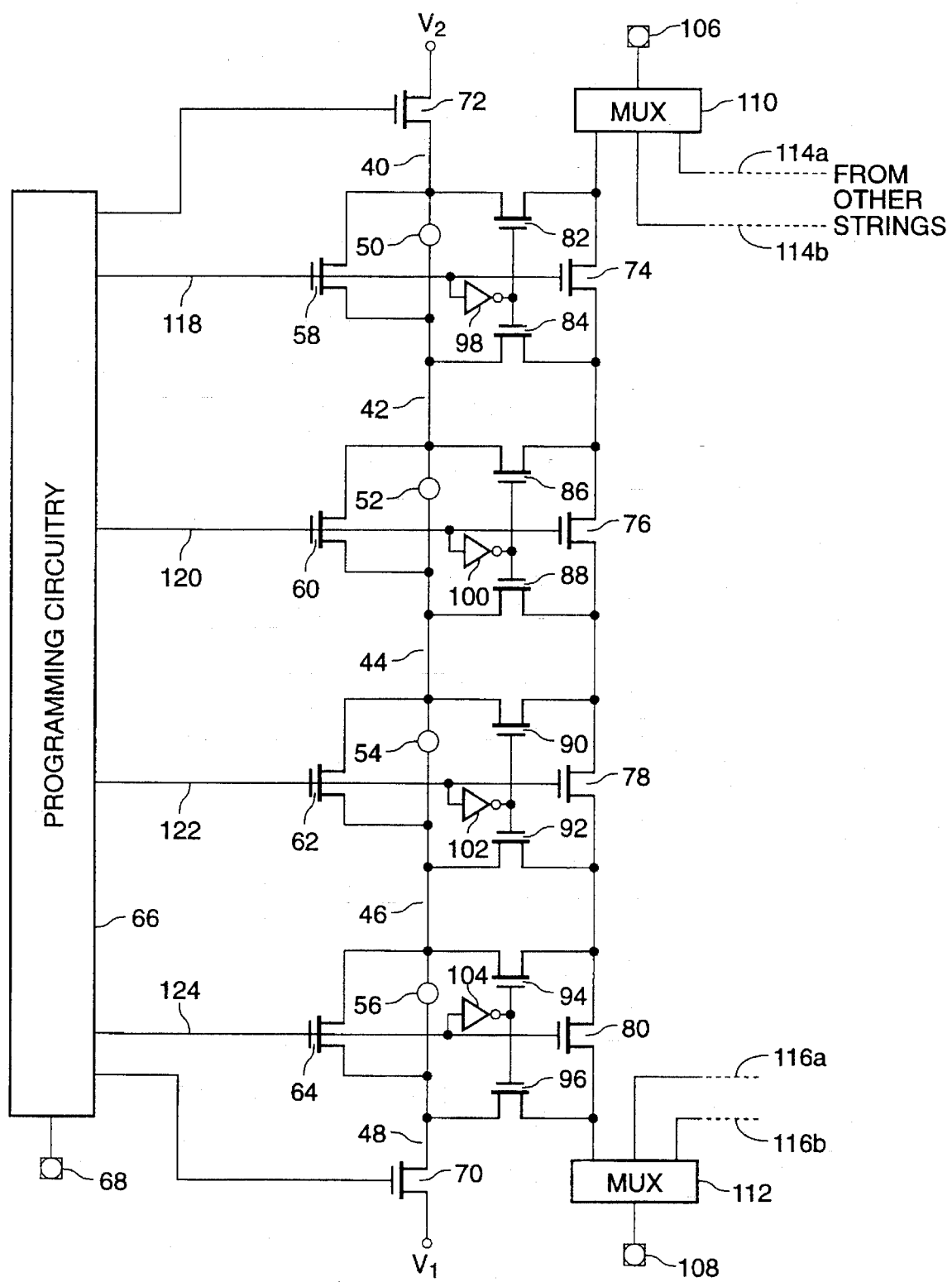
FIG. 2 is a simplified schematic diagram of an antifuse architecture and accompanying programming circuit wherein a plurality of segments of an interconnect conductor may be programmably connected to one another by antifuses and including the antifuse resistance measuring circuit of the present invention.

The typical environment in which the present invention will be employed is more complex than the illustrative embodiment shown in FIG. 1. Referring now to FIG. 2, a schematic diagram of a more realistic arrangement of the circuitry of the present invention is shown. The context of FIG. 2 is a typical interconnect track, composed of interconnect conductor segments 40, 42, 44, 46, and 48, which may be programmably connected to one another by programming selected ones of antifuses 50, 52, 54, and 56. Such a structure is typically found in antifuse based user programmable circuit architectures. Those of ordinary skill in the art will recognize that user functional circuitry of some type, such as represented by circuitry 12 of FIG. 1, may be associated with one or more of the interconnect conductor segments 40, 42, 44, 46, and 48. In the example shown in FIG. 2, such circuitry is omitted to avoid overcomplicating the drawing and thereby obscuring the disclosure of the present invention.

In order to aid in the programming of selected ones of antifuses 50, 52, 54, and 56, series-pass transistors 58, 60, 62, and 64 are connected in parallel with corresponding antifuses 50, 52, 54, and 56. Series-pass transistors 58, 60, 62, and 64 are controlled from programming circuitry 66, which drives their gates. Series-pass transistors 58, 60, 62, and 64 are used to steer the programming voltage $V_{PP}$ to a selected one of antifuses 50, 52, 54, and 56. This is accomplished by turning on selected ones of series-pass transistors 58, 60, 62, and 64.

For example, if it is desired to program antifuse 54, series pass transistors 58, 60, and 64 would be turned on by programming circuitry 66. Information for controlling programming circuitry 66 may be placed onto I/O pad 68 and serially clocked into the integrated circuit in a known manner to control programming circuitry 66. First and second programming transistors 70 and 72 are turned on by programming circuitry 66 to place the potential difference IV1–V2I across antifuse 54 to program it. Details of the antifuse programming process in an architecture such as the one depicted in FIG. 2 are well known to those of ordinary skill in the art.

As may be seen from FIG. 2, the antifuse resistance measuring circuitry of the present invention may be incorporated into the programmable interconnect architecture of FIG. 2. As in the embodiment of FIG. 1, additional transistors are associated with each series pass transistor 58, 60, 62, and 64. Thus transistor 74 is associated with series-pass transistor 58, transistor 76 is associated with series pass transistor 60, transistor 78 is associated with series pass transistor 62, and transistor 80 is associated with series-pass transistor 64. Transistors 74, 76, 78, and 80 form a series connected string.

In addition, a pair of steering transistors are associated with each antifuse 50, 52, 54, 56. Transistors 82 and 84 are associated with antifuse 50. Transistor 82 has one of its source/drain terminals connected to the first terminal of antifuse 50 and the other one of its source/drain terminals connected to one of the source/drain terminals of transistor 74. Transistor 84 has one of its source/drain terminals connected to the second terminal of antifuse 50 and the other one of its source/drain terminals connected to the other one of the source/drain terminals of transistor 74.

Similarly, transistors 86 and 88 are associated with antifuse 52. Transistor 86 has one of its source/drain terminals connected to the first terminal of antifuse 52 and the other one of its source/drain terminals connected to one of the source/drain terminals of transistor 76. Transistor 88 has one of its source/drain terminals connected to the second terminal of antifuse 52 and the other one of its source/drain terminals connected to the other one of the source/drain terminals of transistor 76. Transistors 90 and 92 are associated with antifuse 54. Transistor 90 has one of its source/drain terminals connected to the first terminal of antifuse 54 and the other one of its source/drain terminals connected to one of the source/drain terminals of transistor 78. Transistor 92 has one of its source/drain terminals connected to the second terminal of antifuse 54 and the other one of its source/drain terminals connected to the other one of the source/drain terminals of transistor 78. Transistors 94 and 96 are associated with antifuse 56. Transistor 94 has one of its source/drain terminals connected to the first terminal of antifuse 56 and the other one of its source/drain terminals connected to one of the source/drain terminals of transistor 80. Transistor 96 has one of its source/drain terminals connected to the second terminal of antifuse 56 and the other one of its source/drain terminals connected to the other one of the source/drain terminals of transistor 80. Transistor pairs 82-84, 86-88, 90-92, and 94-96 are driven by the same gate lines driving transistors 74, 76, 78, and 80, however the signals are inverted by inverters 98, 100, 102, and 104.

One end of the series string of transistors 74, 76, 78, and 80 is coupled to I/O pad 106 and the other end of the series string is coupled to I/O pad 108. In the embodiment of FIG. 2, this coupling is shown made through multiplexers 110 and 112, respectively. The purpose of multiplexers 110 and 112 is to allow other series strings, represented by dashed-line conductors 114a and 114b and 116a and 116b, to be coupled to the same I/O pads 106 and 108. Multiplexers 106 and 108 may be addressed by conventional decoding circuitry as is known in the art by signals provided off chip in the same manner as the signals are provided to programming circuitry 66 from I/O pad 68.

The operation of this embodiment of the resistance measuring circuitry of the present invention may be seen from FIG. 2. If, for example, antifuse 54 is to be programmed, gate lines 118, 120, and 124 from programming circuitry 66 are used to turn on series pass transistors 58, 60, and 64. In addition, first and second programming transistors 70 and 72 are turned on by programming circuitry 66, placing the potential IV1–V2I across antifuse 54 to program it. At the same time, the voltages on gate lines 118, 120, and 124 turn on transistors 74, 76, and 80 in the series string. By the action of inverters 98, 100, and 104, transistors 82, 84, 86, 88, 94, and 96 are turned off and only transistors 90 and 92 are turned on, thus providing a measurement path from the first terminal of antifuse 54 to I/O pad 106 and a path from the second terminal of antifuse 54 to I/O pad 108 through multiplexers 110 and 112, respectively.

Those of ordinary skill in the art will recognize that the measurement paths from antifuse 54 to I/O pads 106 and 108 may have a significant component of resistance due to the on resistance of the transistors and the conductor (i.e., polysilicon line) resistance. However, persons of ordinary skill in the art will recognize that, if a high input impedance voltmeter (i.e., 1 Gohm or more) is employed to measure the voltage between I/O pads 106 and 108, the component of resistance in the circuit path will have a negligible effect on the voltage reading.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an integrated circuit having a plurality of antifuses disposed thereon, each of said antifuses having a first electrode and a second electrode, and further having antifuse programming circuitry disposed thereon, a circuit for determining the resistance of a programmed one off said antifuses comprising:

a first voltage-sensing I/O pad;

a second voltage-sensing I/O pad;

antifuse selection means for selecting one of said antifuses;

first circuit path means, responsive to said selection means, for creating a circuit path from said first voltage-sensing I/O pad to the first electrode of an antifuse selected by said selection means;

second circuit path means, responsive to said selection means, for creating a circuit path from said second voltage-sensing I/O pad to the second electrode of said antifuse selected by said selection means.

2. A method for determining the resistance of a programmed antifuse disposed in an integrated circuit, including the steps of:

providing a circuit path from a first voltage sensing I/O pad on the integrated circuit to a first terminal of the antifuse;

providing a circuit path from a second voltage sensing I/O pad on the integrated circuit to a second terminal of the antifuse;

providing a known soaking current to said antifuse through programming circuitry located on said integrated circuit;

measuring the voltage between said first and second voltage sensing I/O pads with a high impedance voltmeter.

* * * * *

UNITED STATES PATENT AND TRADEMARK OFFICE
CERTIFICATE OF CORRECTION

PATENT NO. : 5,525,909
DATED : June 11, 1996
INVENTOR(S) : John L. McCollum

It is certified that error appears in the above-indentified patent and that said Letters Patent is hereby corrected as shown below:

On Column 3, lines 10-11, replace "$V_{PP}=IV1-V2I$" with --$V_{PP}=|V1-V2|$--.

On Column 3, lines 22-23, replace "$IV1-V2I \geq V_{PP}$" with --$|V1-V2| \geq V_{PP}$--.

On Column 3, line 48, before "is" insert --which--.

On Column 3, line 53, before "a" insert --to--.

On Column 3, line 54, before "voltage" insert --second--.

On Column 4, line 34, replace "$IV1-V2I$" with -- $|V1-V2|$"--.

On Col. 4, lines 45-46, before "sensing" insert --first and second-- and before "32" delete "first and second".

On Coumn 5, line 25, replace "$IV1-V2I$" with --$|V1-V2|$--.

On Column 6, line 29, replace "$IV1-V2I$" with --$|V1-V2|$--.

On Column 6, line 59, replace "off" with --of--.

Signed and Sealed this

Seventh Day of January, 1997

Attest:

BRUCE LEHMAN

*Attesting Officer*          *Commissioner of Patents and Trademarks*